United States Patent [19]

Budelman

[11] Patent Number: 5,394,936

[45] Date of Patent: Mar. 7, 1995

[54] HIGH EFFICIENCY HEAT REMOVAL SYSTEM FOR ELECTRIC DEVICES AND THE LIKE

[75] Inventor: Gerald A. Budelman, Aloha, Oreg.

[73] Assignee: Intel Corporation, Santa Clara, Calif.

[21] Appl. No.: 31,225

[22] Filed: Mar. 12, 1993

[51] Int. Cl.6 ............................................. F28D 15/02
[52] U.S. Cl. ......................... 165/104.33; 165/104.22; 165/104.29; 257/714; 257/715; 361/699; 361/700
[58] Field of Search ...................... 165/104.33, 104.22, 165/104.29; 361/699, 700; 257/714, 715

[56] References Cited

U.S. PATENT DOCUMENTS

| | | | |
|---|---|---|---|
| 3,989,099 | 11/1976 | Hosono et al. | 165/80 |
| 4,020,399 | 4/1977 | Suzuki et al. | 361/331 |
| 4,341,202 | 7/1982 | French | 165/104.22 |
| 4,502,286 | 3/1985 | Okada | 62/119 |
| 4,566,529 | 1/1986 | Klein | 165/32 |
| 4,625,790 | 12/1986 | Obayasu | 165/104.29 |
| 4,949,164 | 8/1990 | Ohashi et al. | 357/82 |
| 5,004,973 | 4/1991 | Taraci et al. | 324/158 |
| 5,099,908 | 3/1992 | Taraci et al. | 165/1 |
| 5,114,318 | 5/1992 | Freeborn | 417/379 |
| 5,168,926 | 12/1992 | Watson et al. | 165/185 |
| 5,195,577 | 3/1993 | Kameda et al. | 165/104.13 |
| 5,203,399 | 4/1993 | Koizumi | 165/104.29 |
| 5,285,347 | 2/1994 | Fox et al. | 361/699 |

FOREIGN PATENT DOCUMENTS

211662 9/1986 Japan.
283454 12/1991 Japan.

Primary Examiner—Martin P. Schwadron
Assistant Examiner—L. R. Leo
Attorney, Agent, or Firm—Blakely, Sokoloff, Taylor & Zafman

[57] ABSTRACT

A heat removal system employing fluid circulation and vaporization for transferring heat from a primary heat sink to a secondary heat sink where the heat is dissipated into the surrounding air is disclosed. The present invention comprises a primary heat sink coupled to a secondary heat sink via flexible tubing. The primary heat sink is bonded directly to an electric device such as a semiconductor device. As the electric device heats up and thereby heats up the primary heat sink, a liquid coolant within the primary heat sink transfers excess heat via the tubing to the secondary heat sink where the heat is dissipated. The cooled coolant is then returned to the primary heat sink via the flexible tubing.

9 Claims, 7 Drawing Sheets

HIGH EFFICIENCY HEAT REMOVAL SYSTEM FOR ELECTRIC DEVICES AND THE LIKE

BACKGROUND OF THE INVENTION

1. Field Of The Invention

The present invention relates to the field of heat removal systems for electrical devices. Specifically, the present invention relates to heat removal systems for semiconductor devices and the like.

2. Description of Related Art

The traditional method for cooling electric devices has been through convection. Using this method, heat is dissipated from an electric device through the outer surfaces of the device into still air or an airflow driven by a fan. In some cases, special heat sink devices have been fitted to the electric devices to provide a more efficient mechanism for dissipating heat from the device using convection. One such heat sink is disclosed in U.S. Pat. No. 5,168,926, entitled "Heat Sink Design Integrating Interface Material", assigned to Intel Corporation. The heat sink described in this patent comprises a flat surface which is bonded directly to a flat surface on a semiconductor device. This heat sink also comprises a plurality of fins extending above the flat surface of the semiconductor device. The plurality of fins substantially increase the surface area of the heat sink thereby increasing the heat dissipation characteristics of the heat sink. Heat generated by the semiconductor device is transferred through an adhesive bonding agent into the heat sink where the heat is effectively dispersed.

As the integration level (i.e., the number of electrical primitives or transistors per device) of electric devices increases, or the power requirements or the operating speed of electric devices increases, the amount of heat generated by these devices increases to a point where conventional air convection solutions are inadequate. Conventional air convection solutions are inadequate because airflow requirements necessary to dissipate the greater level of heat become excessive or the physical size of the heat sink required to dissipate the heat becomes prohibitive. The physical size of a heat sink is a particular problem for compact form factors such as notebook computers.

Other conventional heat dissipation systems include solid state refrigeration systems using the Peltier effect to remove heat. These "heat pump" systems create more heat than they remove thereby contributing to the ultimate thermal problem. Moreover, these systems require considerable electrical power.

Other heat dissipation systems use miniature fans coupled to the fins of a conventional heat sink device. These miniature fans increase the thermal efficiency of a conventional heat sink by increasing the airflow through the heat sink. These fans however, consume additional electrical power, contribute additional audible noise to the system, and increase system failures because of moving parts in the fan.

Thus, a more efficient means for removing heat from heat generating electrical devices is needed.

SUMMARY OF THE INVENTION

The present invention is a heat removal system employing fluid circulation and vaporization for transferring heat from a primary heat sink to a secondary heat sink where the heat is dissipated into the surrounding air. The present invention comprises a primary heat sink coupled to a secondary heat sink via flexible tubing. The primary heat sink is bonded directly to an electric device such as a semiconductor device. As the electric device heats up and thereby heats up the primary heat sink, a liquid coolant within the primary heat sink transfers excess heat via the tubing to the secondary heat sink where the heat is dissipated. The cooled coolant is then returned to the primary heat sink via the flexible tubing.

The primary heat sink includes a primary coolant channel through which liquid and vaporized coolant flows during the operation of the system. The primary coolant channel, being an etched or molded groove, provides a channel through which liquid or vapor coolant may flow. A primary heat sink capping plate is bonded or attached to the upper surface of the primary heat sink to seal the primary coolant channel within the primary heat sink. In this manner, coolant may flow through primary coolant channel without loss due to evaporation.

The primary coolant channel includes a first inflow end and a first outflow end. The first inflow end includes an opening for receiving coolant traveling through the flexible tubing. Similarly, the first outflow end contains an opening through which coolant is purged from the primary heat sink. The coolant passes through the first outflow end and into the flexible tubing for transfer to the secondary heat sink.

The secondary heat sink includes a secondary coolant channel, which is mechanically or chemically etched or molded into the secondary heat sink in a manner similar to the primary coolant channel of the primary heat sink. The secondary heat sink further includes a flexible bladder. The bladder is an expansion chamber providing a volume into which coolant can expand without creating a large pressure increase in the system. In the preferred embodiment, a one-way flow valve is also installed within the secondary heat sink to restrict the flow of coolant to a single direction. A second one-way flow valve is coupled externally to the secondary heat sink.

It is therefore an advantage of the present invention that a primary heat sink may be attached to an electrical device and a secondary heat sink coupled to the primary heat sink may be remotely located from the electrical device. It is a further advantage of the present invention that no electrical power is required by the heat removal system. It is a further advantage of the present invention that the invention uses only the heat generated by the electrical device to self-circulate the coolant within the system. It is a further advantage of the present invention that few moving parts are employed in the design. It is a further advantage of the present invention that the heat removal system of the present invention operates independently of whether the electrical device to which it is coupled is or is not powered. It is a further advantage of the present invention that the primary heat sink of the present invention is coupled to the secondary heat sink by a flexible tubing. It is a further advantage of the present invention that the primary heat sink of the present invention may be configured in a low profile dimension. The present invention is particularly useful for dissipating heat from microprocessors and other semiconductor devices densely populated with transistors and generating high levels of localized heat. It is a further advantage of the present invention that the primary heat sink operates isothermally with respect to the temperature of the electric device and the temperature of the secondary heat sink of the present invention. By operating isothermally, the electric device may be maintained at a pre-selected operating temperature. Therefore, the operation of the electrical device to which the primary heat sink is coupled may be more efficiently calibrated to stricter operating tolerances. It is a further advantage of the present invention that the characteristics of the heat removal system may be varied by choosing an appropriate heat transfer fluid (i.e. coolant) with the system.

These and other advantages of the present invention will be described below in the detailed description of the preferred embodiment of the present invention.

DETAILED DESCRIPTION OF THE PREFERRED EMBODIMENT

The present invention is a heat removal system employing fluid circulation and vaporization for transferring heat from a primary heat sink to a secondary heat sink where the heat is dissipated into the surrounding air. In the following detailed description, numerous specific details are set forth in order to provide a thorough understanding of the present invention. However, it will be apparent to one of ordinary skill in the art that the use of specific details need not be used to practice the present invention. In other circumstances, well known structures, materials, substances, and procedures have not been shown or described in detail in order not to unnecessarily obscure the present invention.

Figure 1:
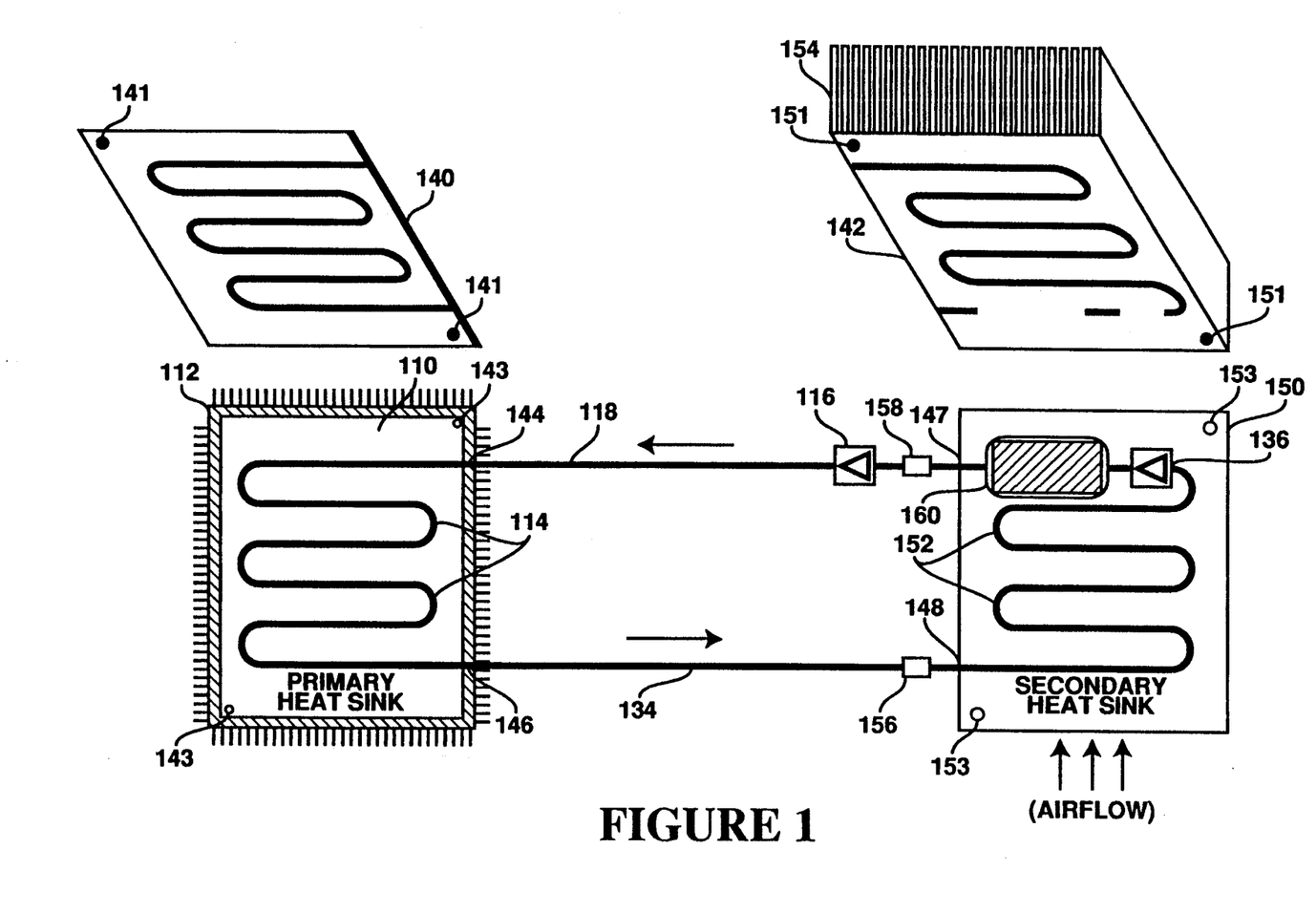
FIG. 1 is a cut away top view of the preferred embodiment of the present invention.

Referring to FIG. 1, a cut away top view of the heat removal system of the preferred embodiment of the present invention is illustrated. As illustrated in FIG. 1, the present invention comprises a primary heat sink 110 coupled to a secondary heat sink 150 via tubing 118 and 134. Primary heat sink 110 is bonded directly to an electric device 112 such as a semiconductor device. As electric device 112 heats up and thereby heats up primary heat sink 110, a liquid coolant within primary heat sink 110 transfers excess heat via tubing 134 to secondary heat sink 150 where the heat is dissipated. The cooled coolant is then returned to primary heat sink 110 via tubing 118. The apparatus and method used in the present invention will be described in detail below for the preferred embodiment illustrated in FIGS. 1 and 3 and alternative embodiments illustrated in FIGS. 2, 4, 5, 6, and 7.

Referring again to FIG. 1, primary heat sink 110 includes a primary coolant channel 114 through which liquid and vaporized coolant flows during the operation of the system. In the preferred embodiment, primary heat sink 110 is fabricated from aluminum or copper. It will be apparent to those of ordinary skill in the art that other materials with acceptable heat transfer properties may equivalently be employed. The primary coolant channel 114 is mechanically or chemically etched or molded into an upper surface of primary heat sink 110. Primary coolant channel 114, being an etched or molded groove, provides a channel through which liquid or vapor coolant may flow. Means and methods for etching or molding a groove into a rigid flat surface are well known to those of ordinary skill in the art. In the preferred embodiment, primary coolant channel 114 is etched or molded in a serpentine pattern to maximize the length of travel of the channel through primary heat sink 110 and thereby maximize the transfer of heat from primary heat sink 110 to the coolant traveling within the primary coolant channel 114. It will be apparent to those of ordinary skill in the art that a pattern other than a serpentine pattern may be employed in the etching or molding of primary coolant channel 114. Moreover, a serpentine pattern with more or less turns may equivalently be used.

Figure 5:
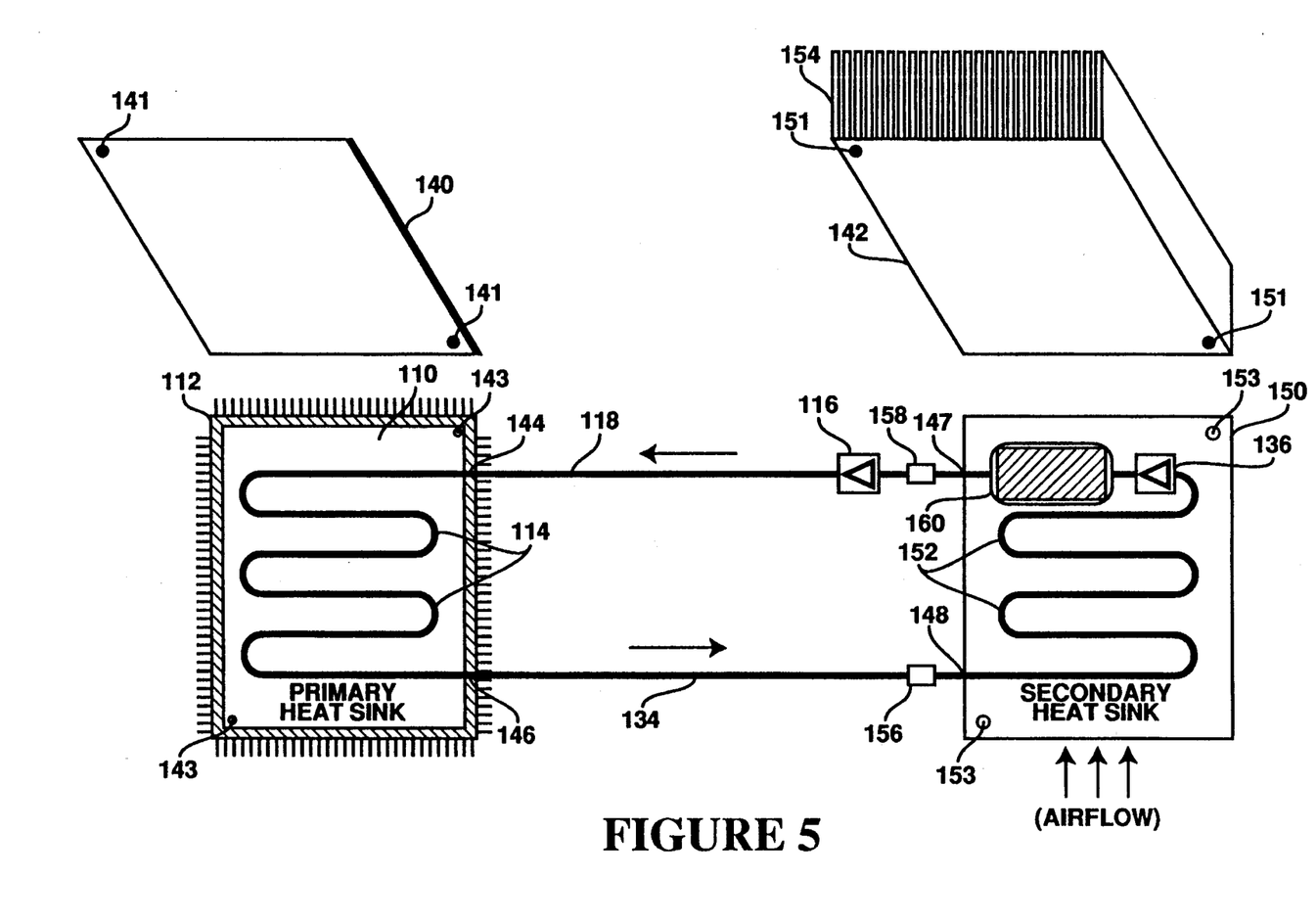
FIG. 5 is a cut away top view of a second alternative embodiment of the present invention.

Having provided a primary coolant channel 114 within primary heat sink 110, a primary heat sink capping plate 140 is bonded or attached to the upper surface of primary heat sink 110 to seal the primary coolant channel 114 within primary heat sink 110. In this manner, coolant may flow through primary coolant channel 114 without loss due to evaporation. As shown in FIG. 1, primary heat sink capping plate 140 may be etched or molded in a similar serpentine pattern corresponding to the pattern etched or molded for primary coolant channel 114. This will increase the diameter of the coolant channel. However, capping plate 140 may also be a flat plate with no etched or molded channel. This alternative embodiment is shown in FIG. 5. Guide posts 141 and holes 143 in diagonal corners of primary heat sink 110 and primary heat sink capping plate 140 assist in the alignment and bonding of capping plate 140 to heat sink 110. Capping plate 140 may be so bonded using any conventional method such as the use of an adhesive compound or a plurality of threaded screws. Capping plate 140 is shown in FIG. 1 prior to being installed on primary heat sink 110 in order to better illustrate the serpentine pattern of the primary coolant channel 114. Once the capping plate 140 is installed, the primary coolant channel 114 is captured within primary heat sink 110 and is no longer visible. Capping plate 140 may be manufactured of the same aluminum or copper material used for primary heat sink 110.

Primary coolant channel 114 includes a first inflow end 144 and a first outflow end 146. First inflow end 144 includes an opening for receiving coolant traveling through tubing 118. Similarly, first outflow end 146 contains an opening through which coolant is purged from primary heat sink 110. The coolant passes through first outflow end 146 and into tubing 134 for transfer to secondary heat sink 150.

Flexible tubing 118 is coupled between primary heat sink 110 and secondary heat sink 150 via one-way flow valve 116 and coupler 158. Tubing 118 is a standard flexible tubing providing a conduit for the transfer of coolant from secondary heat sink 150 to primary heat sink 110. In the preferred embodiment, tubing 118 is a standard PVC robber flexible tubing of a dimension approximately 0.4 centimeters in diameter and up to 18 inches in length. In an alternative embodiment, tubing 118 may be fabricated of a rigid metal or plastic material. However, the flexible form of tubing 118 is advantageous in that secondary heat sink 150 may be positioned in a greater range of arbitrary positions relative to primary heat sink 110. Coupler 158 is provided so tubing 118 and primary heat sink 110 may be conveniently detached from secondary heat sink 150. Coupler 158 is a standard and commonly available coupler for joining two ends of a flexible tube. Such a coupler is well known in the art. It will be apparent to those of ordinary skill in the art that couplers 158 and 156 are optional. In an alternative embodiment, tubing 118 and 134 is coupled directly to secondary heat sink 150.

Figure 6:
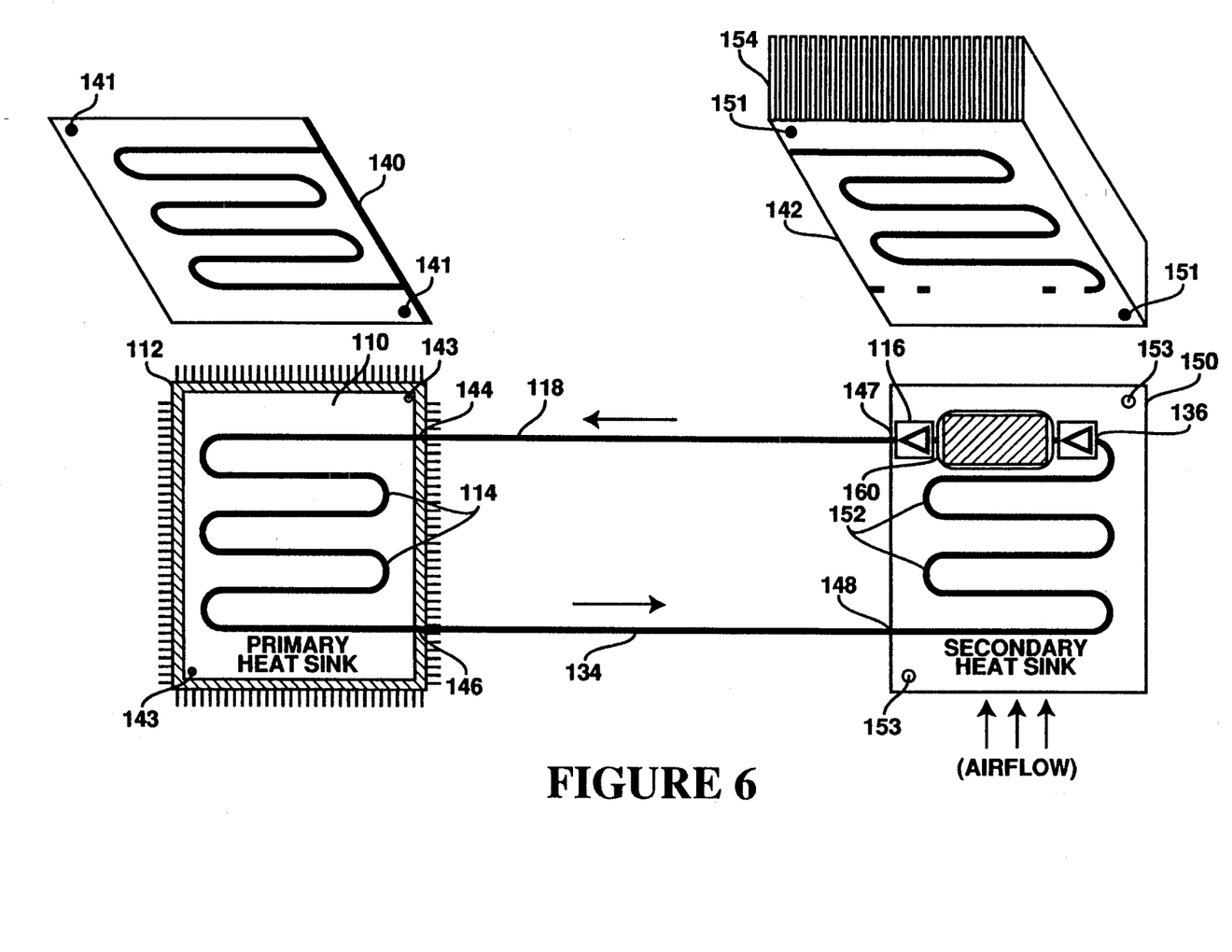
FIG. 6 is a cut away top view of a third alternative embodiment of the present invention.

One-way flow valves 116 and 136 are standard commonly available valves that restrict flow of a fluid through the valve to flow in a single given direction. The direction of travel of coolant flowing through one-way flow valves 116 and 136 are shown by the arrowheads illustrated in FIG. 1. Specifically, one-way flow valves 116 and 136 allow coolant to flow only in a direction toward primary heat sink 110. One-way flow valves 116 and 136 used in the preferred embodiment of the present invention are available under a part designation Model 150 cartridge in a Model 300 housing available from Smart Products, Inc. of San Jose, Calif. In the preferred embodiment, one-way flow valve 116 is coupled with tubing 118. One-way flow valve 136 is installed within secondary heat sink 150. It will be apparent to those skilled in the art that a plurality of one-way flow valves may be employed in the present invention. It will also be apparent to those skilled in the art that one-way flow valves 116 and 136 may both be installed within secondary heat sink 150 as shown in FIG. 6.

Tubing 134 is coupled between primary heat sink 110 and secondary heat sink 150 and coupler 156. Tubing 134 provides a conduit for coolant to flow from primary heat sink 110 to secondary heat sink 150. Tubing 134 is of a material and dimension similar to tubing 118 described above. Coupler 156 is similar to coupler 158 as described above.

Referring still to FIG. 1, secondary heat sink 150 is shown. Secondary heat sink 150 includes a secondary coolant channel 152, which is mechanically or chemically etched or molded into secondary heat sink 150 in a manner similar to that described above for the primary coolant channel 114 of primary heat sink 110. Although secondary heat sink 150 does not need to be fabricated of the same materials used for primary heat sink 110, the etching or molding of a secondary coolant channel 152 within the secondary heat sink 150 may be performed in a similar manner. In the preferred embodiment, secondary coolant channel 152 is arranged in a serpentine pattern to maximize the transfer of heat from the coolant flowing within secondary coolant channel 152 to the secondary heat sink 150 itself.

Secondary heat sink 150 further includes a flexible bladder 160 for retaining a reservoir of coolant as coolant travels through secondary coolant channel 152. Bladder 160 provides a means for storing a quantity of coolant without a large increase in the pressure in the system. In the preferred embodiment, bladder 160 is fabricated of a BUNA-N rubber material. This type of material is well know to those of ordinary skill in the art. As shown in FIG. 1, bladder 160 is installed within secondary heat sink 150 and mated to secondary coolant channel 152 using well known techniques. Bladder 160 is an expansion chamber providing a volume into which coolant can expand without creating a large pressure increase in the system. In the preferred embodiment, one-way flow valve 136 is also installed within secondary heat sink 150 and mated to secondary coolant channel 152 using well known techniques.

Having provided a secondary coolant channel 152, and bladder 160 and one-way flow valve 136 within secondary heat sink 150, a secondary heat sink capping assembly 142 is bonded to the upper surface of secondary heat sink 150. In a manner similar to primary heat sink capping plate 140, secondary heat sink capping assembly 142 seals secondary coolant channel 152, bladder 160 and one-way flow valve 136 within secondary heat sink 150, thereby providing a sealed conduit for the flow of coolant through secondary heat sink 150. Capping assembly 142 is bonded to secondary heat sink 150 using conventional adhesives or a plurality of threaded screws. Guide posts 151 and holes 153 in diagonal corners of capping assembly 142 and secondary heat sink 150 provide means for aligning the mated surfaces of capping assembly 142 and secondary heat sink 150. In order to increase the volume of secondary coolant channel 152, a corresponding channel may be etched or molded into a lower surface of capping assembly 142 in a configuration corresponding to the pattern of secondary coolant channel 152 on secondary heat sink 150. However, capping assembly may alternatively not be etched or molded on a lower surface thereby leaving a flat lower surface. This alternative embodiment is illustrated in FIG. 5. In order to increase the thermal efficiency of secondary heat sink 150, capping assembly 142 is fitted with fins 154 on an upper surface of capping assembly 142. Fins 154 increase the overall surface area of secondary heat sink 150 thereby increasing the capacity of secondary heat sink 150 to dissipate heat. As shown in FIG. 1, an airflow may be generated using a fan (not shown) to increase the flow of air across fins 154 thereby further increasing the capacity of secondary heat sink 150 to dissipate heat.

Figure 7:
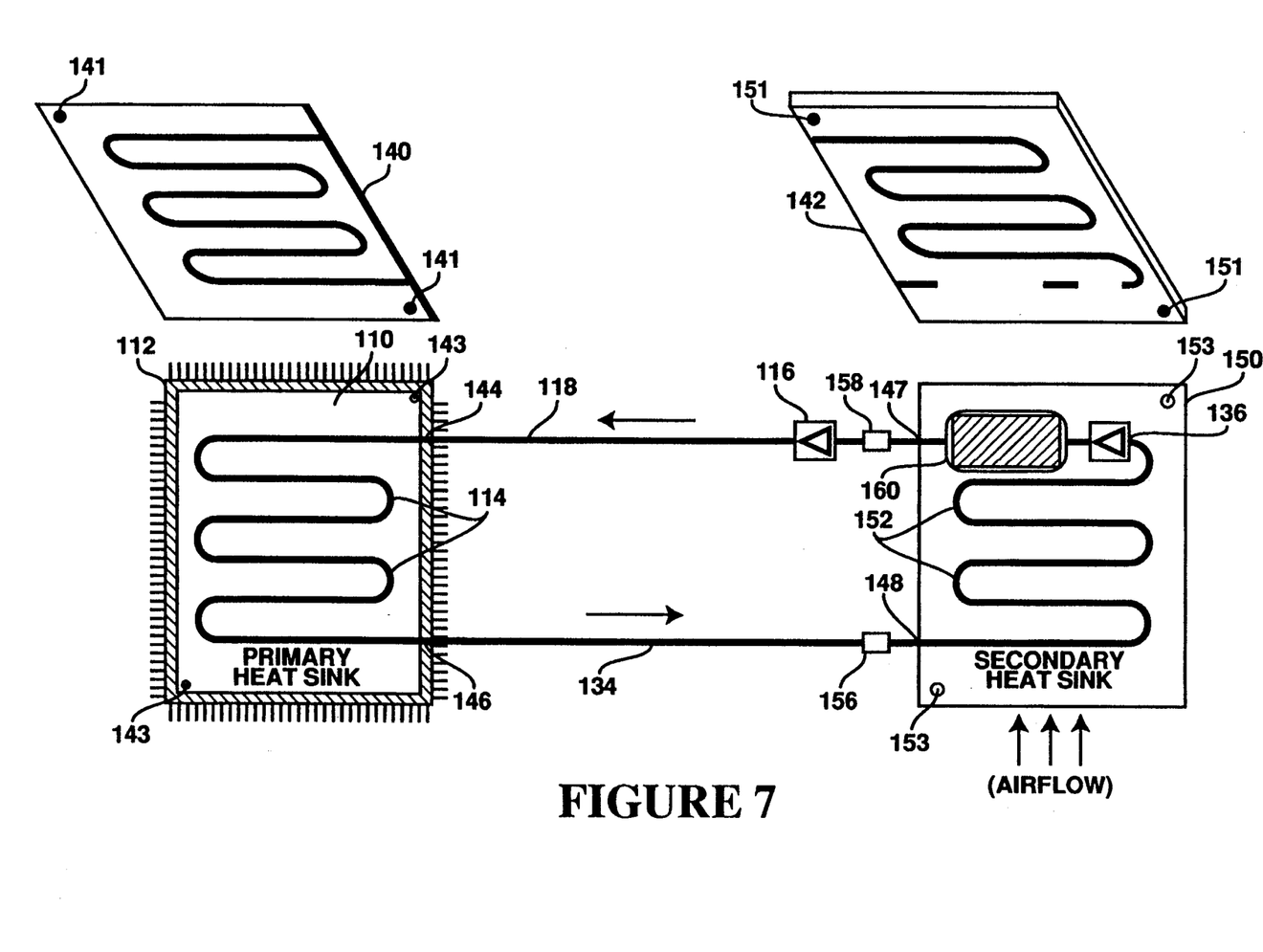
FIG. 7 is a cut away top view of a fourth alternative embodiment of the present invention.

In an alternative embodiment illustrated in FIG. 7, capping assembly 142 is not fitted with heat dissipating fins. Rather, capping assembly 142 comprises a flat upper surface which can be thermally bonded or attached to any convenient structure capable of dissipating heat. For example, the chassis of a computer may be used as such a structure. The flat upper surface of capping assembly 142 is permanently bonded to the heat dissipating structure (e.g., chassis) using well known thermally conductive adhesive agents. Alternatively, the flat upper surface of capping assembly 142 is removably attached to the heat dissipating structure using magnetic attraction. A magnet is used to removably attach capping assembly 142 to the heat dissipating structure while providing a means for conducting heat from secondary heat sink 150 to the heat dissipating structure. It will be apparent to those of ordinary skill in the art that other means may be used for dissipating heat from secondary heat sink 150 and capping assembly 142.

Secondary coolant channel 152 includes a second outflow end 147 which includes an opening through which coolant flows from secondary heat sink 150 through tubing 118 to primary heat sink 110. Similarly, secondary coolant channel 152 includes second inflow end 148 which includes an opening through which coolant flows from primary heat sink 110 to secondary heat sink 150 via tubing 134. Coupler 158 is coupled to second outflow end 147. Coupler 156 is coupled to second inflow end 148.

Thus, the heat removal system of the preferred embodiment of the present invention as illustrated in FIG. 1 and described above forms a closed loop coolant channel through which coolant flows between primary heat sink 110 and secondary heat sink 150 via tubing 118 and 134 and serpentine coolant channels 114 and 152 in primary heat sink 110 and secondary heat sink 150, respectively. In the last stage of fabricating the heat removal system of the present invention, the closed loop coolant channel is filled with coolant. A detailed description of the operation of the present invention is provided below.

Figure 2:
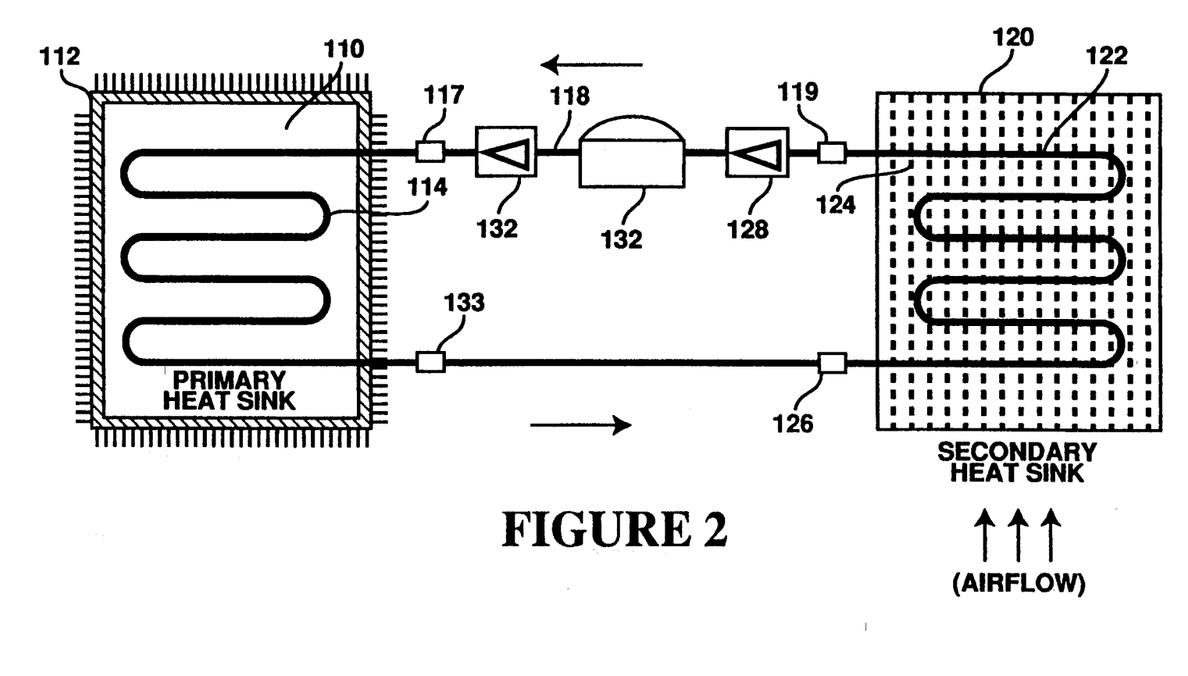
FIG. 2 is a cut away top view of a first alternative embodiment of the present invention.

Referring now to FIG. 2, an alternative embodiment of the heat removal system of the present invention is illustrated. In this alternative embodiment, primary heat sink 110 is essentially the same apparatus as described above in connection with FIG. 1. The main difference in this alternative embodiment is that flexible bladder 130 and one-way flow valve 136 are no longer an integral part of secondary heat sink 120. Instead, flexible bladder 130 and one-way flow valves 132 and 128 are positioned externally to secondary heat sink 120. This alternative embodiment simplifies the manufacture of secondary heat sink 120; however, installation of the alternative heat removal system within an electric device enclosure is complicated by the fact that the flexible bladder 130 and one-way flow valves 132 and 128 must be installed separately from secondary heat sink 120 and primary heat sink 110. As shown in FIG. 2, one-way flow valves 128 and 132 are installed on either side of flexible bladder 130 to ensure that coolant flows through bladder 130 in one direction only. In other respects, the operation of the alternative embodiment illustrated in FIG. 2 is equivalent to the operation of the preferred embodiment illustrated in FIG. 1.

Figure 3:
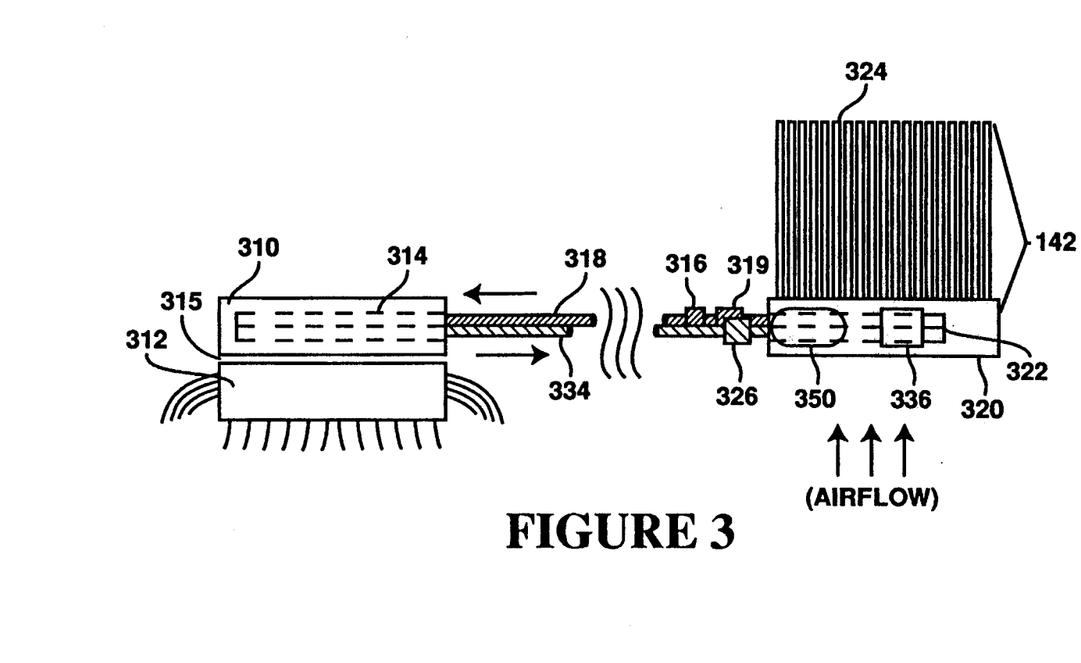
FIG. 3 is a side view of the preferred embodiment.

Referring now to FIG. 3, a side view of the heat removal system of the preferred embodiment is illustrated. As shown, an electric device 312, such as a semiconductor device, is coupled to the primary heat sink 310 of the preferred embodiment. Using conventional techniques, a thermally conductive adhesive is applied between the surfaces 315 of electric device 312 and primary heat sink 310. In this manner, an efficient conductive flow of heat occurs from electric device 312 to primary heat sink 310. Primary coolant channel 314 within primary heat sink 310 is coupled to the first inflow end and tubing 318. Primary coolant channel 314 is also coupled to the first outflow end and tubing 334. Tubing 318 is coupled between the first inflow end and one-way flow valve 316 and coupler 319. Tubing 334 is coupled between the first outflow end and coupler 326. Coupler 319 is coupled to secondary heat sink 320 at the second outflow end. Coupler 326 is coupled to secondary heat sink 320 at the second inflow end. In a manner described above in connection with FIG. 1, the second inflow end and the second outflow end is coupled to secondary coolant channel 322. Secondary coolant channel 322 is coupled to flexible bladder 350 and one-way flow valve 336 which is contained within secondary heat sink 320 in the preferred embodiment of the present invention. As shown in FIG. 3 in its assembled state, fins 324 of the capping assembly 142 are bonded to the top of secondary heat sink 320.

Figure 4:
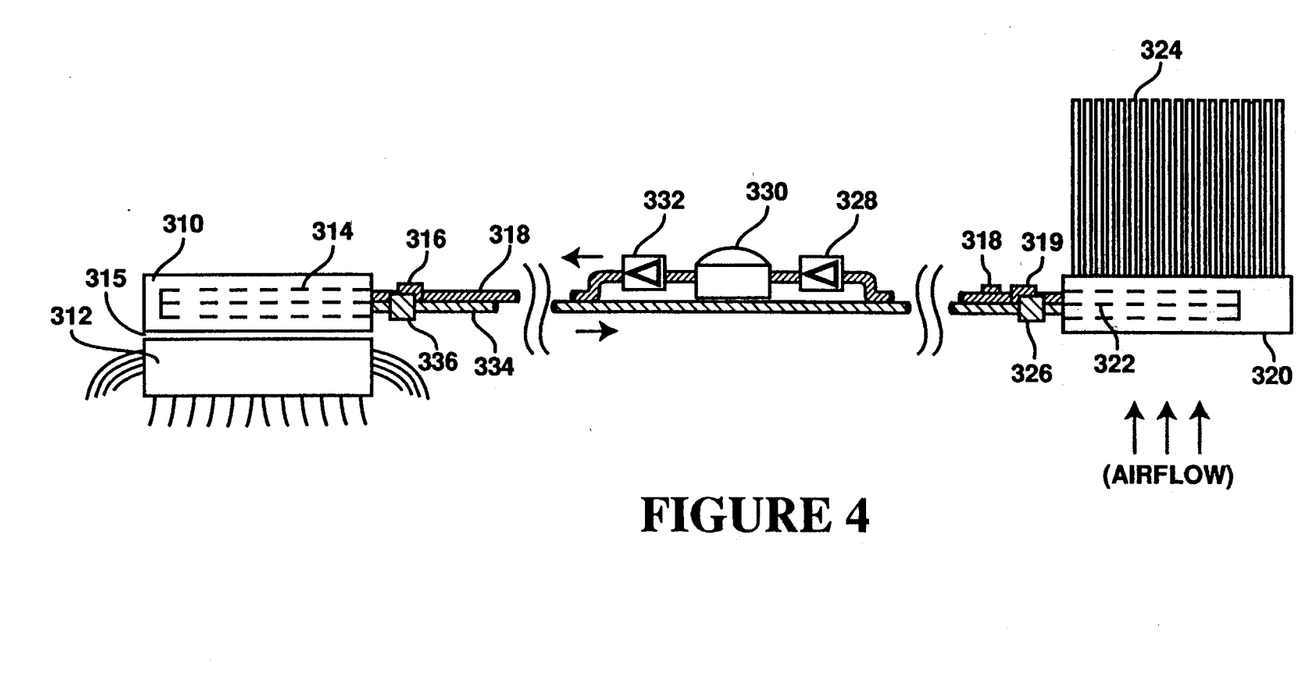
FIG. 4 is a side view of a first alternative embodiment of the present invention.

Referring now to FIG. 4, a side view of an alternative embodiment of the present invention is illustrated. In this alternative embodiment, flexible bladder 330 is positioned externally to secondary heat sink 320. In this configuration, the second outflow end of secondary coolant channel 322 is coupled to bladder 330 through one-way flow valve 328 and coupler 319. The outflow side of bladder 330 is coupled through one-way flow valve 332 to coupler 316 and the first inflow end of primary coolant channel 314. This alternative embodiment is advantageous if it is desirable to position bladder 330 eternally to secondary heat sink 320.

The components of the present invention as described above cooperate together to form a closed loop coolant channel through which coolant is circulated between primary heat sink 110 and secondary heat sink 150. The coolant used in the heat removal system of the present invention may be any of a variety of substances with various characteristics. Such characteristics include a boiling point which is at a desired temperature, a high heat of vaporization, a high latent heat, and a low viscosity. The substance used for coolant must also not react with other materials used in the heat removal system and should be environmentally benign. Some substances appropriate for use as a coolant in the present invention include Diethyl Ether, Methanol (methyl alcohol), Toluene, Ethyl Alcohol, Acetone, and water. Diethyl Ether has a boiling point of about 35° C., which is somewhat low for the purpose of cooling semiconductor devices. However, the boiling point of a Diethyl Ether coolant compound may be raised by mixing water in a desired proportion with the Diethyl Ether. Toluene, Ethyl Alcohol, and Acetone all have the disadvantage of being more likely to react with materials used in the heat removal system. In the preferred embodiment, the best working temperature for cooling semiconductor devices is a coolant temperature of between 50° and 85° C. Coolants with boiling points between 40° and 80° C. are preferred. Thus, Methanol with its 65° C. boiling point is a suitable coolant for use in the preferred embodiment of the present invention. A particular coolant may be mixed with water or other fluids to vary the resulting boiling point. It will be apparent to those of ordinary skill in the art, however that many other substances may be used as coolant within the closed loop coolant channel provided by the present invention.

Having described the structure of the heat removal system of the present invention, the operation of this system will now be described in reference to FIG. 1. During the initial operation of electric device 112, electric device 112 heats up. As electric device 112 heats up, excess heat is transferred to primary heat sink 110 via conduction and subsequently to the coolant contained within primary coolant channel 114. The coolant in primary coolant channel 114 therefore begins to heat up. When the temperature of the coolant reaches its boiling point, a portion of the coolant vaporizes thereby creating a local increase in pressure. As the system operates, the primary heat sink 110 contains coolant in a predominantly vapor state. Secondary heat sink 150 contains coolant in a predominately liquid state. In the manner described below, the coolant circulation system of the present invention is self-pumping.

Advantageously, the vaporization of the coolant contained within primary heat sink 110 consumes a relatively large amount of heat. The pressure increase caused by the vaporization of the coolant in primary heat sink 110 causes the pressure in the entire primary and secondary heat sink system to rise. Because bladder 160 is flexible, previously cooled fluid contained in secondary coolant channel 152 is forced into bladder 160. Heated vapor created in primary coolant channel 114 is forced through first outflow end 146, through tubing 134, and coupler 156 into secondary coolant channel 152. The liquid portion of the coolant, having entered primary heat sink 110 and primary coolant channel 114, via tubing 118, will eventually boil completely. At this time, the vapor portion of the coolant residing in secondary coolant channel 152 will further condense to liquid, thus producing a lower relative pressure in tubing 134 and primary coolant channel 114. The presence of this relatively lower pressure then causes liquid coolant to flow from bladder 160 through one-way flow valve 116 and tubing 118, and into primary heat sink 110. As the liquid coolant drawn into primary coolant channel 114 begins to heat, the vapor pressure thus generated equalizes pressure throughout the system and halts further flow of liquid coolant into primary coolant channel 114. The self-pumping cycle previously described then repeats.

The efficiency of the present invention is increased substantially by the vapor phase cooling effect of the coolant within the closed loop coolant channel of the present invention. This efficiency is substantially greater than the simple convection process used in prior art devices. The present invention is also advantageous in that the coolant is self-circulating or self-pumping within the closed loop coolant channel. The system operates solely on the heat generated by electric device 112. Thus, no failure-prone pumping devices are required to circulate the coolant in the present invention. Other advantages in the present invention include low noise operation, no requirement for electrical power, very low height requirements for primary heat sink 110, and arbitrary positioning of secondary heat sink 150 relative to the position of primary heat sink 110 within an electronic enclosure.

The present invention is particularly useful for dissipating heat generated by state of the art microprocessors. As the number of transistors incorporated within complex semiconductor based microprocessor devices increases, the heat generated by these devices increases dramatically. In fact, the use of mere convection techniques for cooling these devices may effectively limit the functional capabilities of these devices because of the excess generation of heat. The present invention operates isothermally to maintain the temperature of electric device 112 at a temperature near the boiling point of the coolant used inside the closed loop coolant channel. Because of the efficiency of the present invention, the temperature of electric device 112 does not vary substantially from this boiling point temperature. Thus, the present invention provides the advantage that electric device 112 may be designed to more rigid temperature constraints thereby increasing the functionality or performance provided by electric device 112. By appropriately selecting a coolant of a desired vaporization temperature, the operating temperature of electric device 112 may be selectively predetermined. Thus, by filling the closed loop coolant channel of the present invention with coolant having desired properties (i.e. boiling point), the heat removal system of the present invention may be used with a variety of different electric devices. In this manner, the present invention maintains electric device 112 at a preselected temperature.

Thus, a heat removal system employing fluid circulation and vaporization for transferring heat from a primary heat sink to a secondary heat sink where the heat is dissipated into the surrounding air is disclosed. Although the present invention is described herein with reference to a specific embodiment, many modifications and variation therein will readily occur to those of ordinary skill in the art. Accordingly, all such variations and modifications are included within the intended scope of the present invention as defined by the following claims.

I claim:

1. A heat removal system for removing heat from an electric device, said system comprising:
    a primary heat sink coupled to said electric device, said primary heat sink having a primary coolant channel therein, said primary coolant channel being an etched or molded serpentine groove in said primary heat sink, said primary coolant channel having a first outflow end through which coolant exits said primary heat sink, said primary coolant channel having a first inflow end through which coolant enters said primary heat sink;
    a secondary heat sink having a secondary coolant channel therein, said secondary coolant channel being an etched or molded serpentine groove in said secondary heat sink, said secondary coolant channel having a second outflow end through which coolant exits said secondary heat sink, said secondary coolant channel having a second inflow end through which coolant enters said secondary heat sink;
    a flexible bladder included in said secondary heat sink for retaining a reservoir of coolant, said flexible bladder being coupled to said secondary coolant channel:
    a set of fins coupled to said secondary heat sink for improving the dissipation of heat from said secondary heat sink;
    a first tubing disengageably coupling said first outflow end of said primary heat sink with said second inflow end of said secondary heat sink, said first tubing being flexible tubing, said first tubing including a one-way flow valve for restricting the flow of coolant in said first tubing to a single direction;
    a second tubing disengageably coupling said second outflow end of said secondary heat sink with said first inflow end of said primary heat sink, said second tubing being flexible tubing; and
    coolant circulating in said primary coolant channel, said secondary coolant channel, said first tubing, and said second tubing.

2. The heat removal system as claimed in claim 1 wherein said second tubing further includes a plurality of one-way flow valves for restricting the flow of said coolant in said second tubing to a single direction.

3. The heat removal system as claimed in claim 1 wherein said coolant has a boiling point between 40° C. and 80° C.

4. The heat removal system as claimed in claim 1 wherein said system self-pumps said coolant.

5. The heat removal system as claimed in claim 1 wherein said coolant includes methanol.

6. The heat removal system as claimed in claim 1 wherein said primary heat sink is bonded to a surface of said electric device with a heat conducting adhesive agent.

7. The heat removal system as claimed in claim 1 wherein said electric device is a semiconductor device.

8. A method for removing heat from an electric device, said method comprising the steps of:
    providing a primary heat sink coupled. to said electric device, said primary heat sink having a primary coolant channel therein, said primary coolant channel being an etched or molded serpentine groove in said primary heat sink, said primary coolant channel having a first outflow end through which coolant exits said primary heat sink, said primary coolant channel having a first inflow end through which coolant enters said primary heat sink;

providing a secondary heat sink having a secondary coolant channel therein, said secondary coolant channel being an etched or molded serpentine groove in said secondary heat sink, said secondary coolant channel having a second outflow end through which coolant exits said secondary heat sink, said secondary coolant channel having a second inflow end through which coolant enters said secondary heat sink;

retaining a reservoir of coolant in a bladder in said secondary heat sink;

providing a set of fins coupled to said secondary heat sink for improving the dissipation of heat from said secondary heat sink;

providing a flexible tubing that disengageably couples said primary heat sink to said secondary heat sink; and circulating coolant between said primary heat sink and said secondary heat sink in said flexible tubing.

9. The method as claimed in claim 8 wherein said step of circulating coolant further includes a step of restricting the flow of said coolant to a single direction.

* * * * *

UNITED STATES PATENT AND TRADEMARK OFFICE
CERTIFICATE OF CORRECTION

PATENT NO. : 5,394,936
DATED : March 7, 1995
INVENTOR(S) : Budelman

It is certified that error appears in the above-identified patent and that said Letters Patent is hereby corrected as shown below:

In column 4, at line 32, delete "comers" and substitute --corners--

In column 4, at line 60, delete "robber" and substitute --rubber--

In column 7, at line 68, delete "eternally" and substitute --externally--

In column 10, at line 24, delete "channel:" and substitute --channel;--

In column 10, at line 60, delete "coupled." and substitute --coupled--

Signed and Sealed this

Twenty-fourth Day of September, 1996

Attest:

BRUCE LEHMAN

Attesting Officer     Commissioner of Patents and Trademarks